(12) United States Patent
Yamanaka

(10) Patent No.: US 9,863,764 B2
(45) Date of Patent: Jan. 9, 2018

(54) STORAGE MEDIUM, SHAPE CALCULATION DEVICE, AND SHAPE MEASUREMENT METHOD

(71) Applicant: TOSHIBA MEMORY CORPORATION, Tokyo (JP)

(72) Inventor: Eiji Yamanaka, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 42 days.

(21) Appl. No.: 15/064,940

(22) Filed: Mar. 9, 2016

(65) Prior Publication Data

US 2017/0074647 A1 Mar. 16, 2017

(30) Foreign Application Priority Data

Sep. 11, 2015 (JP) ................. 2015-180172

(51) Int. Cl.
*G01B 15/04* (2006.01)
*H01L 23/00* (2006.01)
*H01L 21/66* (2006.01)

(52) U.S. Cl.
CPC .............. *G01B 15/04* (2013.01); *H01L 22/00* (2013.01); *G01B 2210/56* (2013.01)

(58) Field of Classification Search
CPC ...... G01B 15/04; G01B 2210/56; H01L 22/00
See application file for complete search history.

(56) References Cited

U.S. PATENT DOCUMENTS

| 8,243,880 B2 | 8/2012 | Ishibashi |
| 8,908,830 B2 | 12/2014 | Omote et al. |
| 2011/0135062 A1* | 6/2011 | Ishibashi ............... G01B 15/04 378/89 |

FOREIGN PATENT DOCUMENTS

| JP | 2007-285923 | 11/2007 |
| JP | 2009-163185 | 7/2009 |
| JP | 2011-117894 | 6/2011 |
| WO | WO 2010/119844 A1 | 10/2010 |

* cited by examiner

*Primary Examiner* — Mark R Gaworecki
(74) *Attorney, Agent, or Firm* — Finnegan, Henderson, Farabow, Garrett & Dunner, L.L.P.

(57) ABSTRACT

According to one embodiment, a recording medium records a shape calculation program that causes a computer to calculate a shape of a periodic structure. The shape calculation program causes the computer to extract a second scattering profile from a first scattering profile obtained when the electromagnetic waves are incident and to extract a fourth scattering profile from a third scattering profile calculated using a second periodic structure that is virtually set. The shape calculation program causes the computer to perform fitting between the second scattering profile and the fourth scattering profile and to calculate the shape of the first periodic structure on the basis of the result of the fitting.

20 Claims, 8 Drawing Sheets

CROSS-SECTIONAL
SHAPE OF PATTERN

CROSS-SECTIONAL
SHAPE OF PATTERN

CROSS-SECTIONAL
SHAPE OF PATTERN

CROSS-SECTIONAL
SHAPE OF PATTERN

STORAGE MEDIUM, SHAPE CALCULATION DEVICE, AND SHAPE MEASUREMENT METHOD

CROSS-REFERENCE TO RELATED APPLICATIONS

This application is based upon and claims the benefit of priority from Japanese Patent Application No. 2015-180172, filed on Sep. 11, 2015; the entire contents of which are incorporated herein by reference.

FIELD

Embodiments described herein relate generally to a storage medium, a shape calculation device, and a shape measurement method.

BACKGROUND

In the manufacture of a semiconductor device, it is important to manage the shape of a pattern formed on a substrate in order to maintain desired quality. This pattern is measured by various devices. A small angle X-ray scattering device using small angle X-ray scattering (SAXS) has been developed as one of pattern shape measurement devices.

However, in the small angle X-ray scattering device according to the related art, a periodic structure that is virtually set is simplified to some extent on the basis of an expected structure. Therefore, it is impossible in reality to completely match the actual pattern having a complicated structure that is partially constricted with a periodic structure that is virtually set. For this reason, when there is a large difference between the periodic structure that is virtually set and the actual structure, it is difficult to measure the shape of the pattern with high accuracy.

DETAILED DESCRIPTION

In general, according to one embodiment, a non-transitory computer readable medium is provided. The recording medium records a shape calculation program that causes a computer to calculate a shape of a periodic structure. The shape calculation program causes the computer to extract, from a first scattering profile of electromagnetic waves obtained when the electromagnetic waves are incident on a first periodic structure on a substrate, a second scattering profile on the basis of a certain condition. The shape calculation program causes the computer to extract, from a third scattering profile calculated using a second periodic structure that is virtually set, a fourth scattering profile on the basis of the certain condition. The shape calculation program causes the computer to fit the second scattering profile and the fourth scattering profile. The shape calculation program causes the computer to calculate a shape of the first periodic structure on the basis of the result of the fitting.

Hereinafter, a storage medium, a shape calculation device, and a shape measurement method according to an embodiment will be described in detail with reference to the accompanying drawings. The invention is not limited by the embodiment.

Embodiment

Figure 1:
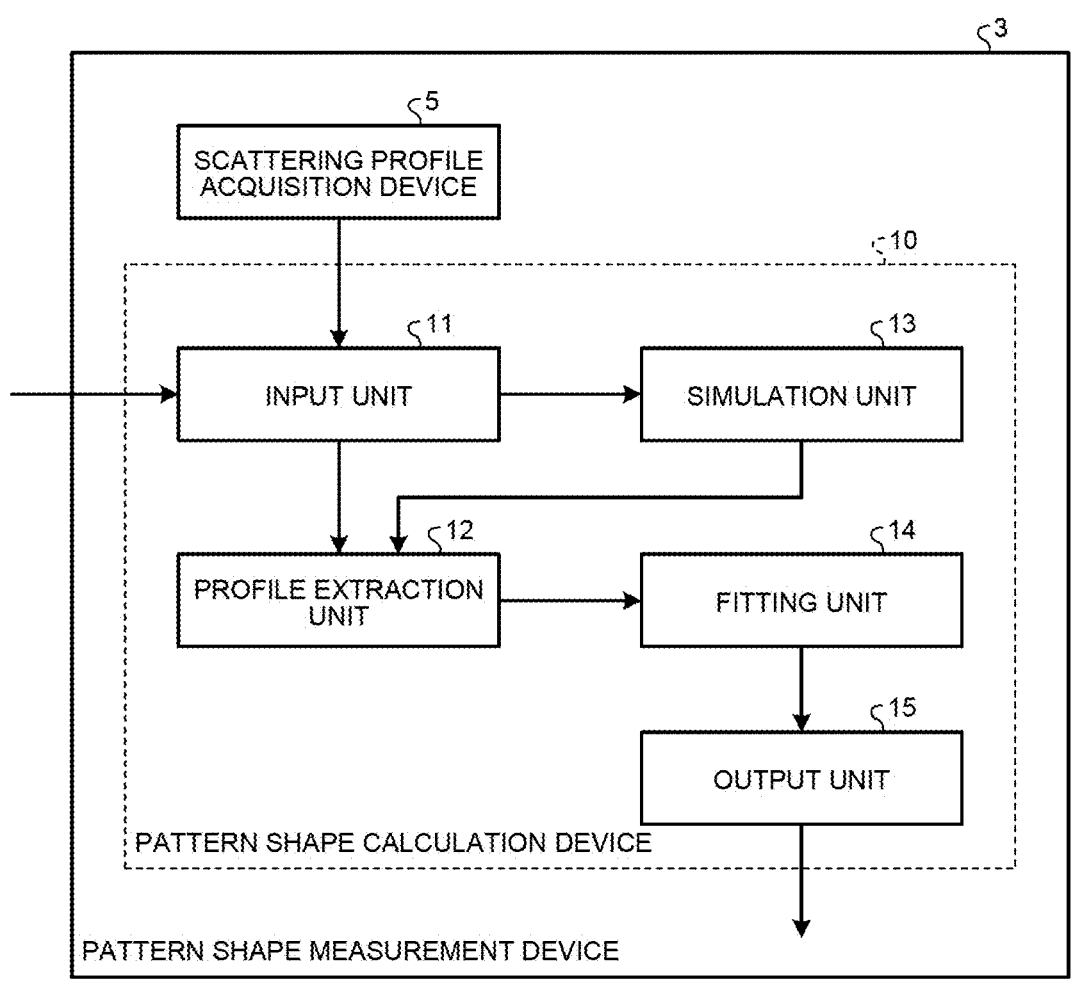
FIG. 1 is a block diagram illustrating the structure of a shape measurement device including a shape calculation device according to an embodiment.

FIG. 1 is a block diagram illustrating the structure of a shape measurement device including a shape calculation device according to an embodiment. A pattern shape measurement device 3 measures the shape of a pattern having a periodic structure. The pattern shape measurement device 3 measures the shape of a pattern using small angle X-ray scattering (SAXS).

The pattern shape measurement device 3 includes a scattering profile acquisition device 5 and a pattern shape calculation device 10. The pattern shape measurement device 3 measures a pattern which is formed on a glass substrate or a wafer. The pattern (sample) to be measured has, for example, a periodic structure such as a line and a space.

The scattering profile acquisition device 5 acquires a scattering profile (diffraction profile) using small angle X-ray scattering. The scattering profile acquisition device 5 irradiates the pattern formed on the substrate with electromagnetic waves such as X-rays. A scattering measurement target pattern has a three-dimensional structure. Therefore, the scattering and interference of X-rays occur in the surface of the pattern, depending on the shape of the pattern. The scattering profile acquisition device 5 detects the X-rays which are scattered and interfere with each other in the surface of the pattern, using a two-dimensional detector, and acquires a scattering profile (scattering intensity distribution) which appears in the two-dimensional detector. The scattering profile acquisition device 5 transmits the acquired scattering profile to the pattern shape calculation device 10.

The pattern shape calculation device 10 calculates the shape of the pattern on the basis of the scattering profile. The pattern shape calculation device 10 floats each shape parameter of a cross-sectional shape model (a virtual structure which will be described below) to calculate a repetitive scattering profile. The pattern shape calculation device 10 outputs the measurement result of a cross-sectional shape model which is most matched with the measured profile.

The pattern shape calculation device 10 includes an input unit 11, a profile extraction unit (a profile extraction module) 12, a simulation unit (a simulation module) 13, a fitting unit (a fitting module) 14, and an output unit 15. The input unit 11 receives the scattering profile transmitted from the scattering profile acquisition device 5 and transmits the scattering profile to the profile extraction unit 12.

In addition, the input unit 11 receives setting information used to calculate a pattern shape from an external device (not illustrated) and transmits the setting information to the profile extraction unit 12 or the simulation unit 13. The setting information used to calculate a pattern shape includes, for example, profile extraction conditions D1, virtual structure data D3, and shape parameter simulation setting D4 which will be described below. The input unit 11 transmits the profile extraction conditions D1 to the profile extraction unit 12. In addition, the input unit 11 transmits the virtual structure data D3 and the shape parameter simulation setting D4 to the simulation unit 13.

The profile extraction conditions D1 are information which defines the conditions of the scattering profile to be extracted from the scattering profile. A characteristic part of the scattering profile which changes with respect to a shape parameter (a shape element of the pattern) of interest is set as the profile extraction conditions D1. For example, an M-th (M is a natural number) minimum point of an N-th-order ray (N is a natural number) is set as the profile extraction conditions D1. The profile extraction conditions D1 are set on the basis of information about at least one of the scattering angle of X-rays, the order of the scattering profile, and the peak of the scattering profile. The peak of the scattering profile is the top (the top of a mountain) or the bottom (the bottom of a valley) of a waveform and is also referred to as an inflection point. One or a plurality of conditions are set as an extraction target in the profile extraction conditions D1.

The virtual structure data D3 is data for the periodic structure which is virtually set. The virtual structure data D3 defines the virtual structure of the pattern to be measured. The shape parameter simulation setting D4 is information for defining the shape parameters of the virtually-set periodic structure. In the shape parameter simulation setting D4, one or a plurality of shape parameters are set.

The profile extraction unit 12 extracts a portion (feature point) of the scattering profile (measured scattering profile) which has been measured, on the basis of the profile extraction conditions D1. Specifically, the profile extraction unit 12 extracts a scattering profile indicating a characteristic portion of the pattern from the measured scattering profile. The profile extraction unit 12 extracts an element which is defined by the profile extraction conditions D1 from the scattering profile. The profile extraction unit 12 transmits the extracted data as measured scattering profile extraction data D2 to the fitting unit 14.

In addition, the profile extraction unit 12 extracts a portion (feature point) of the scattering profile from virtual scattering profile data D5, which will be described below, on the basis of the profile extraction conditions D1. Specifically, the profile extraction unit 12 extracts a scattering profile indicating a characteristic portion of the pattern from the virtual scattering profile data D5. The profile extraction unit 12 extracts the same feature point as that extracted from the measured scattering profile from the virtual scattering profile data D5. The profile extraction unit 12 transmits the extracted data as virtual scattering profile extraction data D6 to the fitting unit 14.

The simulation unit 13 calculates the virtual structure of the pattern. The virtual structure has the same periodic structure as that of the pattern on the substrate. The simulation unit 13 calculates a scattering intensity distribution based on the virtual structure, using a scattering intensity distribution simulation program, and generates the virtual scattering profile data D5. Specifically, the simulation unit 13 calculates a virtual structure (a cross-sectional shape model indicating the shape of a pattern) using the virtual structure data D3 and the shape parameter simulation setting D4.

For example, when the pattern to be measured is a line and space pattern, a measurement target position in the line and space pattern is determined in the virtual structure data D3. In the shape parameter simulation setting D4, detailed dimensions at the position defined by the virtual structure data D3 are defined. The simulation unit 13 applies the dimensions in the shape parameter simulation setting D4 to the virtual structure data D3 to calculate a virtual structure. The simulation unit 13 performs a scattering simulation using the calculated virtual structure. The execution result of the scattering simulation is the virtual scattering profile data D5. The scattering simulation is a program that calculates X-rays which are scattered and interfere with each other in the surface of the pattern of the virtual structure when the virtual structure is irradiated with X-rays under the same conditions as those of the pattern on the substrate.

The simulation unit 13 calculates the virtual structure and the virtual scattering profile data D5 for all dimensions which are set in the shape parameter simulation setting D4. The simulation unit 13 transmits the generated virtual scattering profile data D5 to the profile extraction unit 12.

The fitting unit 14 performs fitting between the measured scattering profile extraction data D2 and the virtual scattering profile extraction data D6 to calculate a fitting residual (fitting result). The fitting residual is a difference between the measured scattering profile extraction data D2 and the virtual scattering profile extraction data D6.

The fitting unit 14 generates correspondence relationship information D7 in which the shape parameter of the virtual structure and the fitting residual are associated with each other and stores the correspondence relationship information D7. The shape parameter of the virtual structure is a shape parameter which is used to generate the virtual scattering profile data D5 among the shape parameters defined by the shape parameter simulation setting D4. Therefore, the correspondence relationship information D7 is information in which the fitting residual is associated with the shape parameter of the virtual structure used to calculate the fitting residual.

The fitting unit 14 extracts the shape parameter corresponding to the minimum fitting residual from the correspondence relationship information D7. The fitting unit 14 transmits the extracted shape parameter as the shape of the periodic structure on the substrate (the calculation result of the shape) to the output unit 15. The output unit 15 outputs the shape of the periodic structure on the substrate to, for example, an external device.

The pattern shape calculation device 10 may be mounted in a hardware manner (for example, a system on chip). Alternatively, the pattern shape calculation device 10 may be mounted in a software manner. Alternatively, some of the functions of the pattern shape calculation device 10 may be mounted in a hardware manner and the other functions thereof may be mounted in a software manner.

The pattern to be measured is, for example, a large scale integration (LSI) circuit pattern. The pattern shape measurement device 3 measures the shape of the pattern during a semiconductor device manufacturing process.

Figure 2:
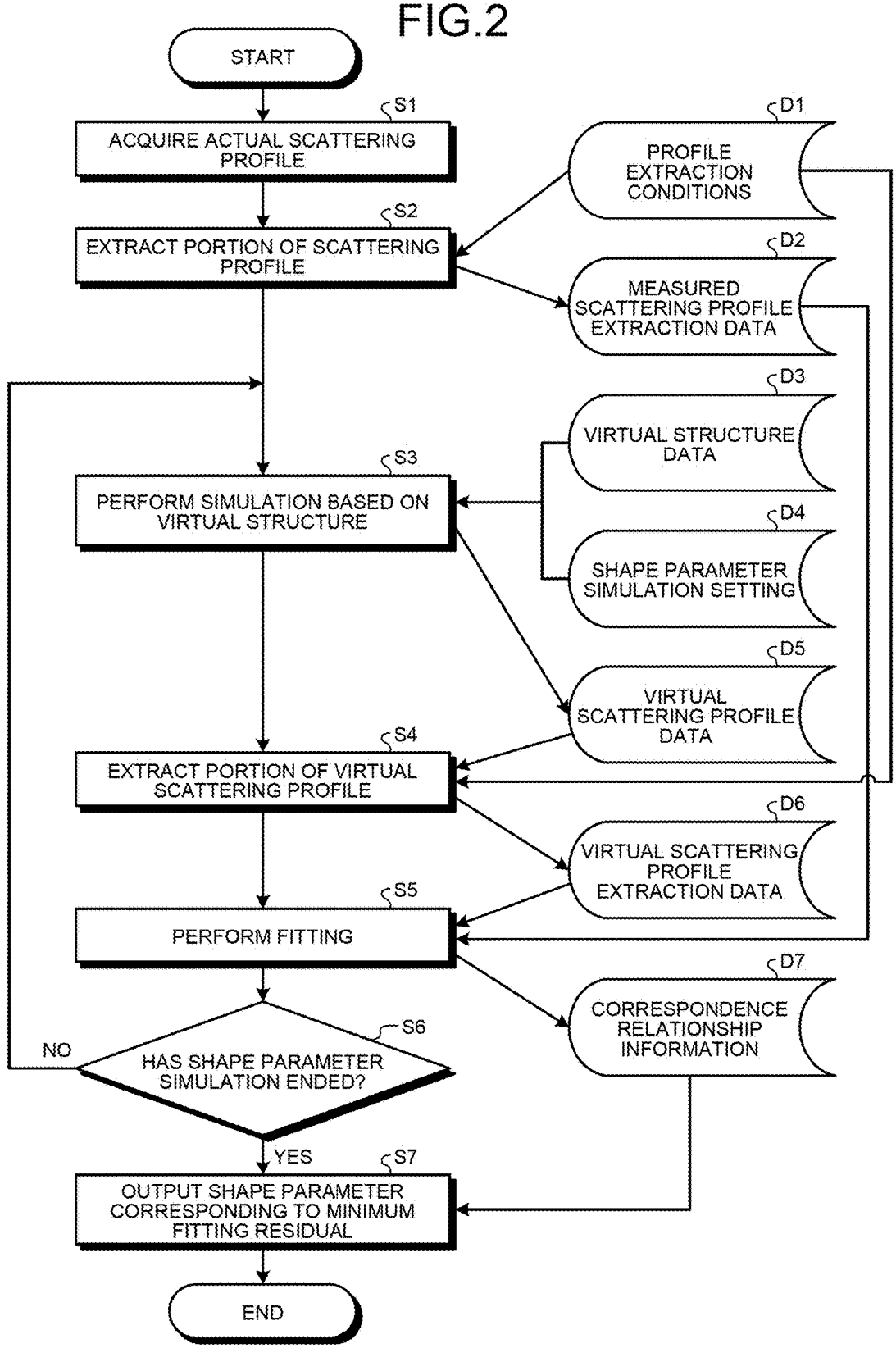
FIG. 2 is a flowchart illustrating the flow of a shape calculation process of the shape calculation device according to the embodiment.

FIG. 2 is a flowchart illustrating the flow of a shape calculation process of the shape calculation device according to the embodiment. After a pattern having a periodic structure is formed on a substrate, the scattering profile acquisition device 5 irradiates the pattern formed on the substrate with X-rays. Then, a characteristic interference pattern corresponding to the cross-sectional structure of the pattern appears in the two-dimensional detector of the scattering profile acquisition device 5. The scattering profile acquisition device 5 detects the X-rays which are scattered and interfere with each other in the surface of the pattern, using the two-dimensional detector, and acquires an actual scattering profile that appears in the two-dimensional detector (Step S1). The scattering profile acquisition device 5 converts the acquired scattering profile (two-dimensional scattering intensity image) into a measured scattering profile indicating scattering intensity and transmits the measured scattering profile to the pattern shape calculation device 10.

In the pattern shape calculation device 10, the input unit 11 transmits the measured scattering profile to the profile extraction unit 12. In addition, the input unit 11 transmits the profile extraction conditions D1 from an external device to the profile extraction unit 12. In addition, the input unit 11 transmits the virtual structure data D3 and the shape parameter simulation setting D4 from the external device to the simulation unit 13.

The profile extraction unit 12 extracts a portion (for example, a feature point) of the scattering profile on the basis of the profile extraction conditions D1 (Step S2). In this case, the profile extraction unit 12 extracts an element which is defined by the profile extraction conditions D1 from the scattering profile. In this way, the profile extraction unit 12 extracts a profile indicating a characteristic portion of the pattern from the scattering profile.

The profile extraction unit 12 transmits the extracted data as the measured scattering profile extraction data D2 to the fitting unit 14. The fitting unit 14 stores the measured scattering profile extraction data D2.

The simulation unit 13 calculates the virtual structure of the pattern and performs a simulation based on the virtual structure to generate the virtual scattering profile data D5 (Step S3). In this case, the simulation unit 13 calculates the virtual structure, using the virtual structure data D3 and the shape parameter simulation setting D4.

The simulation unit 13 applies the dimensions in the shape parameter simulation setting D4 to the virtual structure data D3 to calculate the virtual structure. Then, the simulation unit 13 applies the virtual structure to a scattering simulation to obtain the virtual scattering profile data D5 as the simulation result.

Figure 3:
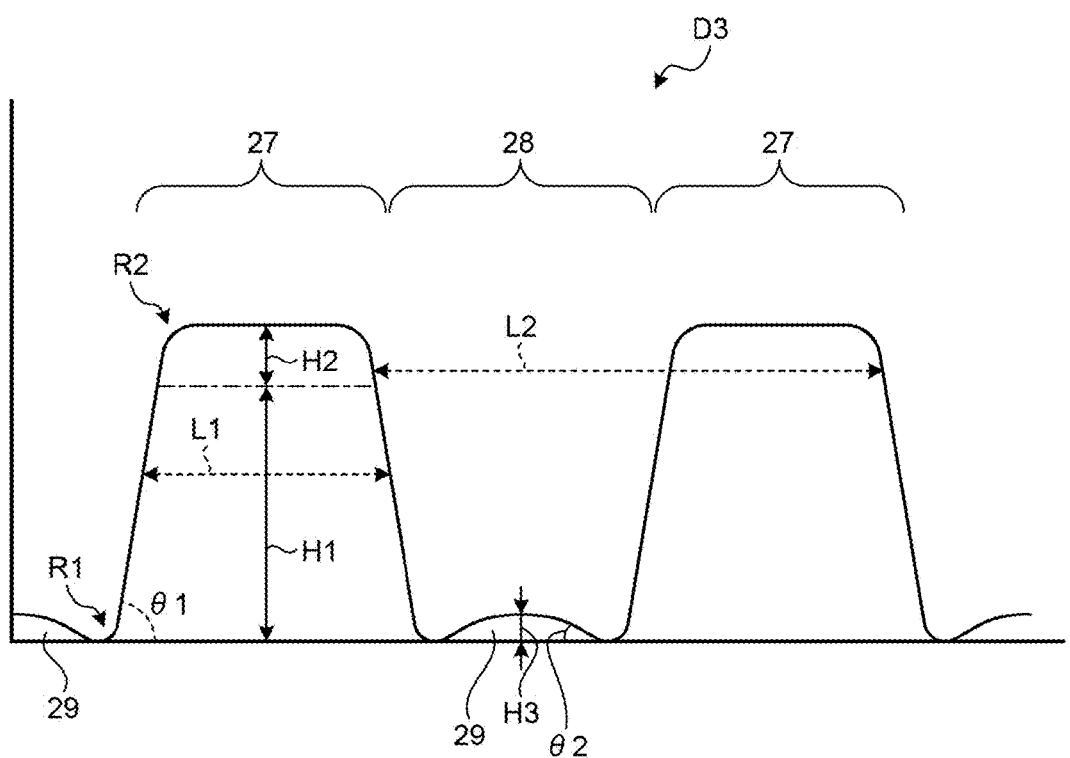
FIG. 3 is a diagram illustrating an example of virtual structure data.

FIG. 3 is a diagram illustrating an example of the virtual structure data. FIG. 3 illustrates an example of the virtual structure data D3 when the pattern to be measured is a line and space pattern. In the virtual structure data D3, the position of a measurement target relative to the line and space pattern is set. In addition, the dimensions of the measurement target are set in the shape parameter simulation setting D4. In other words, in the virtual structure data D3, information about the definition (calculation position) of the dimensions of the line and space pattern is set.

A calculation target (measurement target) which is set in the virtual structure data D3 is, for example, the width L1 of a line pattern 27 and a pitch L2. The pitch L2 is the sum of the width of one line pattern 27 and the width of one space pattern 28.

In addition, the calculation target set in the virtual structure data D3 may include the height H1 of the line pattern 27 except for the head and the height H2 of the head of the line pattern 27. The calculation target set in the virtual structure data D3 may include the curvature R1 of a skirt pattern 29 which is connected to the bottom of the line pattern 27 and the curvature R2 of the head of the line pattern 27. The skirt pattern 29 is a residual film pattern which is formed in the space pattern 28.

The calculation target set in the virtual structure data D3 may include the angle θ1 of a wall surface at the bottom of the line pattern 27 and the angle θ2 of a wall surface at the bottom of the skirt pattern 29. The angle θ1 of the wall surface is an angle formed between a side wall and a lower surface at the bottom of the line pattern 27. The angle θ2 of the wall surface is an angle formed between a side wall and a lower surface at the bottom of the skirt pattern 29. In addition, the calculation target set in the virtual structure data D3 may include the height H3 of the skirt pattern 29.

In the shape parameter simulation setting D4, the detailed values of the width L1, the pitch L2, the heights H1 to H3, the curvatures R1 and R2, and the angles θ1 and θ2 of the wall surfaces are set. For example, in the shape parameter simulation setting D4, for example, L1-1 (nm), L1-2 (nm), and L1-3 (nm) are set as the width L1. Any of the values in the shape parameter simulation setting D4 is applied to the virtual structure data D3 to set the virtual structure of the pattern.

The simulation unit 13 transmits the generated virtual scattering profile data D5 to the profile extraction unit 12. Then, the profile extraction unit 12 stores the virtual scattering profile data D5.

The profile extraction unit 12 extracts a portion (feature point) of the scattering profile from the virtual scattering profile data D5, on the basis of the profile extraction conditions D1 (Step S4). In this way, the profile extraction unit 12 extracts a scattering profile indicating a characteristic portion of the pattern from the virtual scattering profile data D5. In this case, the profile extraction unit 12 extracts the same feature point as that extracted from the measured scattering profile from the virtual scattering profile data D5.

The extracted feature point is a point on the scattering profile corresponding to an important position of the pattern to be measured. The extracted feature point is, for example, a point on the scattering profile corresponding to an element (a position which has a great effect on dimensions or an angle) of which the dimensions are managed during the manufacture of the pattern.

The pattern to be measured is, for example, an element (for example, a width or an angle formed between the surface of a side wall and a lower surface) of which the dimensions are managed. In this embodiment, a point on the scattering profile corresponding to an L-th (L is a natural number) element and a point on the virtual scattering profile data D5 corresponding to the L-th element are extracted. The profile extraction unit 12 extracts the element which is defined by the profile extraction conditions D1 from the virtual scattering profile data D5.

The profile extraction unit 12 transmits the extracted data as the virtual scattering profile extraction data D6 to the fitting unit 14. The fitting unit 14 stores the virtual scattering profile extraction data D6.

The fitting unit 14 performs the fitting between the measured scattering profile extraction data D2 and the virtual scattering profile extraction data D6 (Step S5). In this way, the fitting unit 14 calculates a fitting residual (fitting result). The fitting residual is the difference between the measured scattering profile extraction data D2 and the virtual scattering profile extraction data D6.

The fitting unit 14 generates the correspondence relationship information D7 in which the shape parameter of the virtual structure used to generate the fitting residual is associated with the fitting residual and stores the correspondence relationship information D7.

The simulation unit 13 determines whether a shape parameter simulation has ended (Step S6). When a scattering simulation has been performed for all of the shape parameters defined by the shape parameter simulation setting D4, it is determined that the shape parameter simulation has ended.

When it is determined that the shape parameter simulation has not ended (Step S6, No), the pattern shape calculation device 10 repeatedly performs the process from Step S3 to Step S6. As such, the process from Step S3 to Step S6 is repeated until a simulation is performed for all of the shape parameters defined by the shape parameter simulation setting D4.

When it is determined that the shape parameter simulation has ended after the process from Step S3 to Step S6 (Step S6, Yes), the fitting unit 14 refers to the correspondence relationship information D7. Then, the fitting unit 14 extracts the shape parameter corresponding to the minimum fitting residual from the correspondence relationship information D7. The fitting unit 14 transmits the extracted shape parameter as the shape of the periodic structure on the substrate to the output unit 15. The output unit 15 outputs the shape of the periodic structure on the substrate to, for example, an external device (Step S7).

Figure 4:
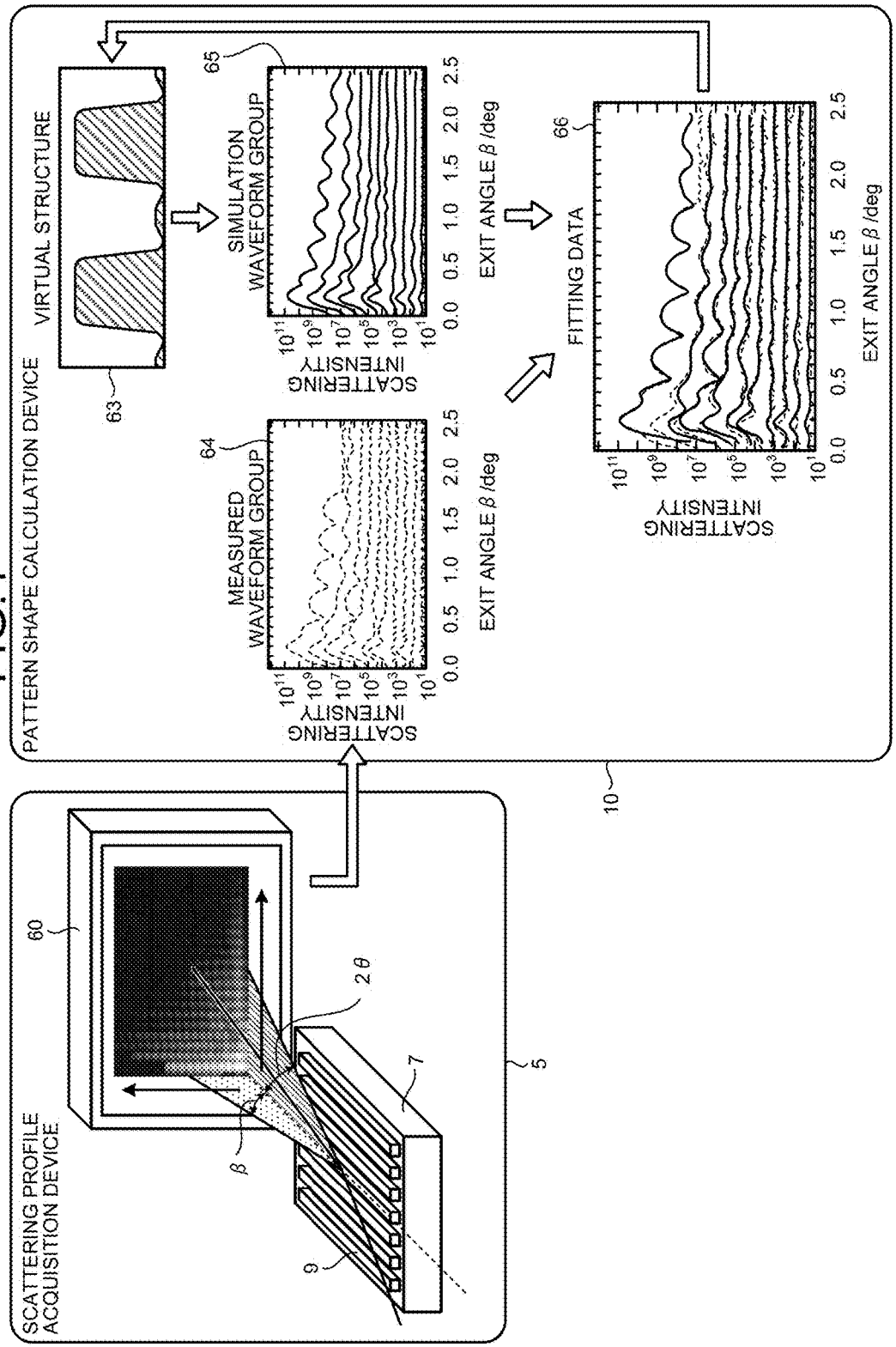
FIG. 4 is a diagram illustrating fitting between measurement data and calculated data.

Next, a fitting process of the fitting unit 14 will be described. FIG. 4 is a diagram illustrating the fitting between measured data and calculated data. In the following description, the measured scattering profile which is the measured data is referred to as a measured waveform group 64 and the virtual scattering profile data D5 which is calculated data is referred to as a simulation waveform group 65.

A pattern 9 which is a periodic structure is formed in, for example, a linear shape in which a certain direction is a longitudinal direction. Specifically, the pattern 9 is a line pattern including a plurality of bodies which are arranged in parallel. Here, a surface of a substrate 7 on which the pattern 9 is formed is referred to as a reference surface. The substrate 7 is placed on a stage (not illustrated). The stage is configured so as to be rotatable in the plane that is parallel to the reference surface.

The scattering profile acquisition device 5 includes a two-dimensional detector 60. The scattering profile acquisition device 5 emits X-rays to the periodic structure at a small incident angle (about 0.2 degrees) while changing an azimuth angle in the plane that is parallel to the reference surface of the substrate (sample) 7 on which the periodic structure (pattern 9) is formed.

The X-rays are reflected from the periodic structure and are scattered in an azimuth angle direction which is a direction parallel to the reference surface and an elevation angle direction which is a direction perpendicular to the reference surface. The azimuth angle is an angle in the plane that is parallel to the reference surface and the elevation angle is an angle in the plane that is perpendicular to the reference surface.

The two-dimensional detector 60 includes a plurality of light receiving units (not illustrated) which are arranged in two-dimensional array. The light receiving unit functions as a detection element which detects X-rays. The two-dimensional detector 60 detects a two-dimensional intensity distribution of the X-rays. The two-dimensional detector 60 is arranged at a position that is sufficiently far away from the substrate 7 on the stage in order to detect the scattered X-rays from the line pattern with high resolution. In the two-dimensional detector 60, a diffraction peak appears in the azimuth angle direction and an interference fringe appears for each diffraction peak in the elevation angle direction due to the interference between the X-rays scattered by the pattern 9.

As such, the two-dimensional detector 60 detects the scattering intensity distribution (scattering profile) of the scattered X-rays. In FIG. 4, a diffraction angle (scattering angle) when X-rays are emitted is represented by $2\theta$ and an exit angle is represented by $\beta$. The scattering profile detected by the two-dimensional detector 60 includes information in the lateral direction, such as the width of the pattern 9, and information in the longitudinal direction, such as the height of the pattern 9. In addition, the detected scattering intensity distribution forms a characteristic interference pattern in which the periodic structure on the substrate 7 is reflected.

The scattering profile detected by the two-dimensional detector 60 is digitized and converted into the measured waveform group 64 which is the measured scattering profile. The measured waveform group 64 indicates the scattering intensity distribution of the X-rays reflected from the pattern 9.

The scattering profile acquisition device 5 emits X-rays to the pattern 9 while rotating the stage having the substrate 7 placed thereon, thereby changing the incident azimuth angle of X-rays on the pattern 9. The change in the incident azimuth angle of X-rays on the pattern 9 makes it possible to acquire scattered light under various diffraction conditions.

The two-dimensional detector 60 detects the X-rays which have been reflected from the pattern 9 and then scattered in the azimuth angle direction and the elevation angle direction. A two-dimensional scattering intensity image indicating the intensity distribution of the X-rays is created from the detection result of the X-rays by the two-dimensional detector 60.

The obtained two-dimensional scattering intensity image is divided into scattering profiles in the azimuth angle direction and the elevation angle direction and the scattering profiles in each direction are calculated. The measured waveform group 64 is calculated as the scattering profile in the elevation angle direction. As such, the measured waveform group 64 is a waveform group obtained by actually measuring the pattern 9. In a graph indicating the measured waveform group 64, the horizontal axis is an exit angle and the vertical axis is scattering intensity. The two-dimensional scattering intensity image may be converted into the measured waveform group 64 (measured scattering profile) by the scattering profile acquisition device 5 or the profile extraction unit 12 of the pattern shape calculation device 10.

A virtual structure 63 of the pattern 9 is calculated on the basis of the virtual structure data D3 and the shape parameter simulation setting D4. In addition, a simulation waveform group 65 which is the virtual scattering profile data D5 is generated by a simulation based on the virtual structure 63. The simulation waveform group 65 is a waveform group obtained by a scattering intensity distribution simulation. In a graph indicating the simulation waveform group 65, the horizontal axis is an exit angle and the vertical axis is scattering intensity.

For example, the simulation waveform group 65 can be calculated on the basis of optical conditions and pattern information. The optical conditions include, for example, the wavelength, incident azimuth angle, and incident elevation angle of X-rays which are incident on the pattern 9 and the scattering azimuth angle and scattering elevation angle of X-rays which are scattered from the pattern 9. The pattern information includes the material and cross-sectional shape (virtual structure 63) of the pattern 9. The virtual structure 63 is the cross-sectional contour shape of the line pattern of the pattern 9 and is represented by a shape parameter function. The scattering profile of X-rays is calculated by performing Fourier transform for a function indicating the cross-sectional shape. When the value of the shape parameter is changed, the intensity of X-rays in an interference fringe and the cycle or shape of the interference fringe are changed, which results in a change in the simulation waveform group 65 which is a scattering profile. In the graph indicating the measured waveform group 64 or the simulation waveform group 65, the horizontal axis may be a scattering angle (an azimuth angle or an elevation angle).

After the measured waveform group 64 and the simulation waveform group 65 are obtained, the fitting between the measured waveform group 64 and the simulation waveform group 65 is performed. As such, the fitting between the measured scattering profile and the scattering profile calculated by a simulation is performed. In this way, fitting data 66 is generated. The fitting data 66 includes information about the difference between the measured waveform group 64 and the simulation waveform group 65.

The pattern shape calculation device 10 floats each shape parameter of the virtual structure data D3 on the basis of the shape parameter simulation setting D4 and repeatedly calculates the virtual structure 63. In addition, the pattern shape calculation device 10 calculates the simulation waveform group 65 using the virtual structure. Then, the pattern shape calculation device 10 performs the fitting between the measured waveform group 64 and each simulation waveform group 65. The pattern shape calculation device 10 repeats the calculation of the virtual structure 63, the calculation of the simulation waveform group 65, and the fitting process. Then, the pattern shape calculation device 10 extracts the shape parameter corresponding to the minimum fitting residual from the fitting result and outputs the shape parameter.

In this embodiment, the profile extraction unit 12 extracts a portion of the measured waveform group 64 and generates the measured scattering profile extraction data D2. In addition, the profile extraction unit 12 extracts a portion of the simulation waveform group 65 and generates the virtual scattering profile extraction data D6. Then, the fitting unit 14 performs the fitting between the measured scattering profile extraction data D2 and the virtual scattering profile extraction data D6. As such, the fitting between a portion (a portion indicating a characteristic shape) of the measured waveform and a portion (a portion indicating a characteristic shape) of the simulation waveform is performed.

Figure 5:
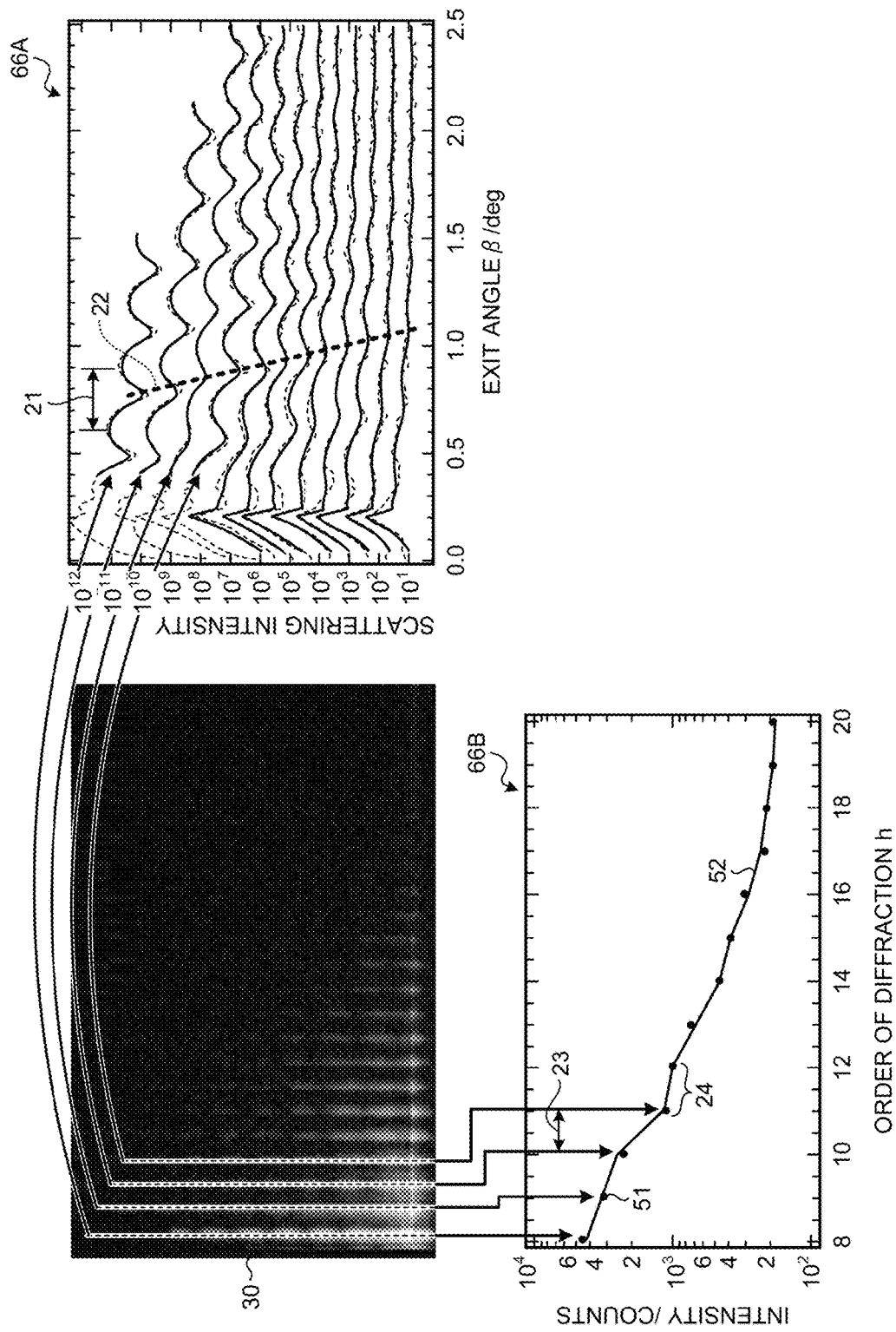
FIG. 5 is a diagram illustrating fitting data.

Here, the fitting data 66 will be described. FIG. 5 is a diagram illustrating the fitting data. In the following description, the fitting data 66 having the information of the pattern in the height direction is referred to as fitting data 66A. In addition, the fitting data 66 having the information of the pattern in the lateral direction (width direction) is referred to as fitting data 66B.

A scattering profile 30 (two-dimensional scattering intensity image) detected by the two-dimensional detector 60 is divided into a scattering profile in the azimuth angle direction and a scattering profile in the elevation angle direction.

The scattering profile in the azimuth angle direction is the measured waveform group 64 illustrated in FIG. 4 and is represented by a dashed line in the fitting data 66A. The scattering profile in the elevation angle direction is the fitting data 66B illustrated in FIG. 5.

The measured waveform group 64 indicates a scattering intensity distribution in the horizontal plane and a diffraction peak in which the pitch between the line patterns is reflected appears in the measured waveform group 64. The fitting data 66B in the elevation angle direction indicates scattering intensity in the vertical direction and an interference fringe in which the height of the line pattern is reflected appears in the fitting data 66B. The scattering profile in the elevation angle direction is obtained for each diffraction peak.

The scattering profile 30 detected by the two-dimensional detector 60 is digitized and converted into the measured waveform group 64. In addition, the simulation waveform group 65 is calculated using the virtual structure. The fitting between the measured waveform group 64 and the simulation waveform group 65 is performed to generate the fitting data 66A.

In the fitting data 66A illustrated in FIG. 5, a waveform group represented by a dashed line corresponds to the measured waveform group 64 and a waveform group represented by a solid line corresponds to the simulation waveform group 65. The fitting data 66A is generated on the basis of information about the pattern to be measured in the height direction.

In the data of the scattering profile 30, data in a P-th (P is a natural number) column from the left side corresponds to a P-th-order ray of diffracted light. In addition, in the fitting data 66A, a waveform in a P-th stage of the measured waveform group 64 and the simulation waveform group 65 corresponds to the P-th-order ray of the diffracted light. Therefore, in the data of the scattering profile 30, data in the P-th column from the left side corresponds to the waveform in the P-th stage of the measured waveform group 64 and the simulation waveform group 65.

In the fitting data 66A, the difference between the measured waveform group 64 and the simulation waveform group 65 are a fitting residual. For example, the difference between the waveform in the P-th stage of the measured waveform group 64 and the waveform in the P-th stage of the simulation waveform group 65 is calculated as the fitting residual of the P-th-order ray.

In the measured waveform group 64 and the simulation waveform group 65, the distance (pitch 21) between an R-th (R is a natural number) maximum point and an (R+1)-th maximum point in the waveform in the first stage (primary ray) is greatly affected by the height of the pattern. Therefore, in the fitting data 66A, as the difference between the pitch 21 of the measured waveform group 64 and the pitch 21 of the simulation waveform group 65 is reduced, the accuracy of calculating the height of the pattern increases.

Therefore, for example, the pitch 21 of the primary ray is set in the profile extraction conditions D1. Therefore, the fitting unit 14 determines, as one of the pattern shape elements, the shape parameter when the difference between the pitches 21 is the minimum (the fitting residual is the minimum).

A line 22 which connects inflection points in a certain stage of each ray includes a large amount of information about the angle of the side wall of the pattern. Therefore, in the fitting data 66A, as the difference between the line 22 of the measured waveform group 64 and the line 22 of the simulation waveform group 65 is reduced, the accuracy of calculating the angle of the side wall increases.

Therefore, for example, the line 22 is set in the profile extraction conditions D1. In this way, the fitting unit 14 determines, as one of the pattern shape elements, the shape parameter when the difference between the lines 22 is the minimum.

Information about the shape of the pattern in the lateral direction in the scattering profile 30 is also digitized and converted into measured scattering intensity. The conversion of the information into the measured scattering intensity may be performed by the scattering profile acquisition device 5 or the profile extraction unit 12 of the pattern shape calculation device 10. In addition, in order to obtain information about the shape of the pattern in the lateral direction, scattering intensity characteristics (simulation scattering intensity) are calculated, using the virtual structure. Then, the fitting between the measured scattering intensity in the lateral direction and the simulation scattering intensity in the lateral direction is performed to generate the fitting data 66B.

In the fitting data 66B illustrated in FIG. 5, a plotted point corresponds to measured scattering intensity 51 in the lateral direction and a waveform indicated by a solid line corresponds to simulation scattering intensity 52 in the lateral direction. As such, the fitting data 66B is generated on the basis of information about the pattern to be measured in the lateral direction.

In the data of the scattering profile 30, the sum of the brightnesses of data in the P-th column from the left side corresponds to the P-th-order ray of the diffracted light. In addition, in the fitting data 66B, a P-th plotted point from the left side corresponds to the P-th-order ray of the diffracted light. Therefore, data in a P-th column from the left side in the scattering profile 30 corresponds to a P-th plotted point of the measured scattering intensity 51.

In the fitting data 66B, the difference between the measured scattering intensity 51 and the simulation scattering intensity 52 is the fitting residual. For example, the difference between the measured scattering intensity 51 in the P-th stage and the simulation scattering intensity 52 in the P-th stage is calculated as the fitting residual of the P-th-order ray.

In the measured scattering intensity 51 and the simulation scattering intensity 52, a gap 23 between adjacent rays is greatly affected by the dimensions of the pattern in the width direction. For example, the distance (gap 23) between the coordinates of a third-order ray in the horizontal axis direction and the coordinates of a fourth-order ray in the horizontal axis direction is greatly affected by the dimensions of the pattern in the width direction. Therefore, a pattern pitch can be calculated on the basis of the gap 23 between the rays in the fitting data 66B. In the fitting data 66B, as the difference (coordinate difference) between the coordinates corresponding to the measured scattering intensity 51 and the coordinates corresponding to the simulation scattering intensity 52 is reduced, the accuracy of calculating the width increases.

Therefore, for example, the difference between the coordinates of adjacent rays in the lateral direction is set in the profile extraction conditions D1. In this way, the fitting unit 14 determines, as one of the pattern shape elements, the shape parameter when the difference between the coordinates of rays is the minimum (the fitting residual is minimum).

The repetition 24 of high and low scattering intensities is greatly affected by the duty ratio of the pattern (the ratio of the width of the line pattern to the width of the space pattern). Therefore, the duty ratio of the pattern can be calculated on the basis of the repetition 24 of high and low scattering intensities in the fitting data 66B. In the fitting data 66B, as the difference (the difference between scattering intensities) between the measured scattering intensity 51 and the simulation scattering intensity 52 is reduced, the accuracy of calculating the duty ratio increases.

Therefore, for example, the difference between the scattering intensities of adjacent rays is set in the profile extraction conditions D1. In this way, the fitting unit 14 determines, as one of the pattern shape elements, the shape parameter when the difference between the scattering intensities of rays is the minimum.

Figure 6:
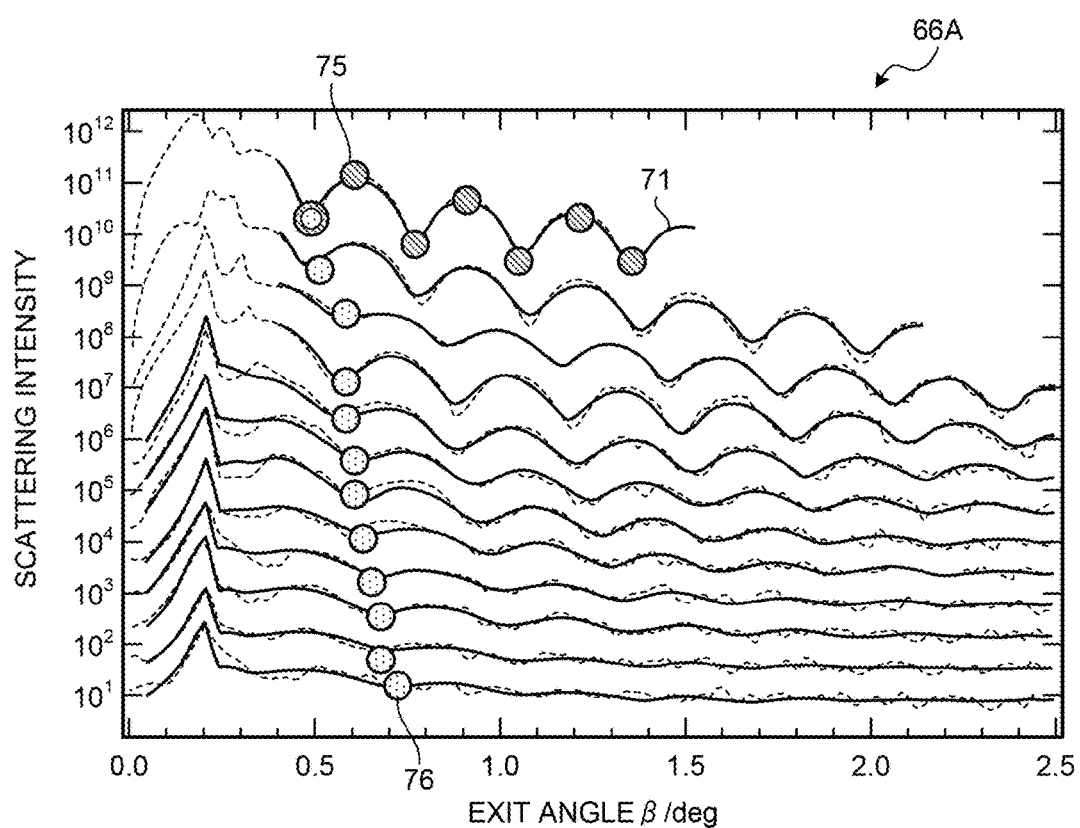
FIG. 6 is a diagram illustrating the setting of profile extraction.

In addition, conditions other than those described in FIG. 5 may be set as the profile extraction conditions D1. Here, another example of the profile extraction conditions D1 will be described. FIG. 6 is a diagram illustrating the setting of profile extraction. Fitting data 66A illustrated in FIG. 6 is the same as the fitting data 66A illustrated in FIG. 5 and includes data for the measured waveform group 64 and the simulation waveform group 65. In the fitting data 66A illustrated in FIG. 6, a waveform group represented by a dashed line corresponds to the measured waveform group 64 and a waveform group represented by a solid line corresponds to the simulation waveform group 65.

In the measured waveform group 64 and the simulation waveform group 65, the dependence of an inflection point 75 of a waveform (primary ray 71) in the first stage on the dimensions of the pattern in the width direction is high. Therefore, in the fitting data 66A, as the difference between the inflection point 75 of the measured waveform group 64 and the inflection point 75 of the simulation waveform group 65 is reduced, the accuracy of calculating the width of the pattern increases.

Therefore, for example, the coordinates of the inflection point 75 are set in the profile extraction conditions D1. In this way, the fitting unit 14 determines, as one of the pattern shape elements, the shape parameter when the difference between the coordinates of the inflection points 75 in the fitting data 66A is the minimum.

In the measured waveform group 64 and the simulation waveform group 65, the dependence of the coordinates of an initial inflection point 76 of each ray on the shape of the side wall of the pattern is high. Therefore, in the fitting data 66A, as the difference between the coordinate of the inflection point 76 of the measured waveform group 64 and the coordinate of the inflection point 76 of the simulation waveform group 65 is reduced, the accuracy of calculating the shape of the side wall increases.

Therefore, for example, the coordinates of the initial inflection point 76 of each ray are set in the profile extraction conditions D1. In this way, the fitting unit 14 determines, as one of the pattern shape elements, the shape parameter when the difference between the initial inflection points 76 of rays is the minimum.

In the measured waveform group 64 and the simulation waveform group 65, the dependence of the second or third maximum point of each ray on the shape of the side wall of the pattern is high. Therefore, for example, the coordinates of the second or third maximum point of each ray may be set in the profile extraction conditions D1.

In the measured waveform group 64 and the simulation waveform group 65, the dependence of the waveforms of all of the primary and secondary rays on the rough shape of the pattern is high. Therefore, in the fitting data 66A, as the difference between all of the waveforms of the primary and secondary rays in the measured waveform group 64 and all of the waveforms of the primary and secondary rays in the simulation waveform group 65 is reduced, the accuracy of calculating the shape of the pattern increases.

Therefore, for example, all of the waveforms of the primary and secondary rays may be set in the profile extraction conditions D1. In this way, the fitting unit 14 determines, as one of the pattern shape elements, the shape parameter when the difference between the waveforms of the primary and secondary rays is the minimum.

FIGS. 7A to 7D are diagrams illustrating examples of the measurement result of the pattern by the pattern shape measurement device. FIGS. 7A to 7D illustrate the cross-sectional shapes of patterns. In the pattern shape measurement device 3, the scattering profile acquisition device 5 acquires a scattering profile. Then, the pattern shape calculation device 10 calculates a scattering profile. The pattern shape calculation device 10 determines various pattern shape elements on the basis of a portion of the scattering profile. In this way, the measurement result of the shape of the pattern is determined.

Figure 7A:
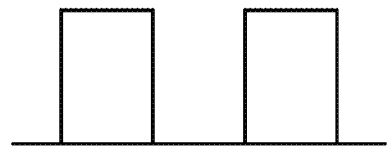
FIGS. 7A to 7D are diagrams illustrating examples of the measurement results of patterns by the pattern shape measurement device.
Figure 7B:
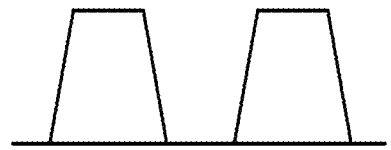
Figure 7C:
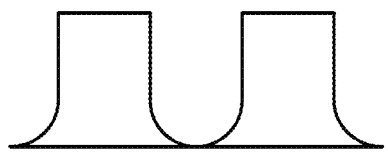
Figure 7D:
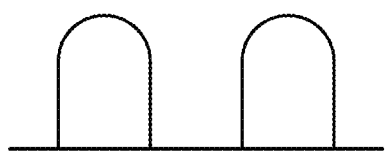

FIG. 7A is a cross-sectional view illustrating a pattern which has a rectangular shape in a cross-sectional view. FIG. 7B is a cross-sectional view illustrating a pattern which has a trapezoidal (tapered) shape in a cross-sectional view. FIG. 7C is a cross-sectional view illustrating a pattern which has a round bottom in a cross-sectional view. FIG. 7D is a cross-sectional view illustrating a pattern which has a round top in a cross-sectional view.

As described above, the pattern shape calculation device 10 performs the fitting between a first scattering profile which is actually measured and a second scattering profile which is obtained by a simulation. Then, the pattern shape calculation device 10 calculates the surface shape of a periodic structure on the basis of information about a portion of the first and second scattering profiles, of which the dependence on the shape parameter of interest is high. In this way, it is possible to reduce an error in the calculation result of the surface shape due to the influence of the shape parameter to which no attention is paid. Therefore, it is possible to measure the shape of the pattern for the shape parameter of interest with high accuracy.

In the measurement of the shape of a pattern by a scanning electron microscope (SEM), in some cases, it is difficult to obtain desired measurement accuracy since resolution is insufficient due to the scaling-down of the pattern. It is important to manage the cross-sectional shape of the pattern in the vertical direction in addition to the dimensions of the pattern in the horizontal direction. As a method for measuring the cross-sectional shape in a non-destructive manner, a scatterometry method is put to practical use. In some cases, desired measurement accuracy is not obtained due to the scaling-down of the pattern.

In this embodiment, the shape of a pattern is measured by small angle X-ray scattering. Therefore, it is possible to measure the shape of the pattern with high accuracy. In addition, the fitting between the measured scattering profile and the scattering profile obtained by a simulation is performed for the shape parameter of interest. Therefore, after unnecessary shape parameters are removed, fitting is performed. As a result, it is possible to measure, for example, the round shape of a pattern in detail. For example, it is possible to maintain the accuracy of measuring the shape parameter of interest even in a situation in which there is a large change in shape.

The measurement of the shape of a pattern by the pattern shape measurement device 3 is applied to, for example, a mask forming process or a wafer process. In this case, for example, the pattern shape measurement device 3 measures the shape of a resist pattern.

When the measurement result indicates a failure, the resist pattern peels off. Then, a resist pattern is formed again under other conditions. When the measurement result indicates success, a pattern is formed on a substrate using the resist pattern. In the mask forming process, a mask pattern is formed using the resist pattern. Then, a semiconductor device (semiconductor integrated circuit) is manufactured using the mask having the mask pattern formed therein.

In the wafer process, a wafer pattern is formed using the resist pattern. In the wafer process, the measurement of the shape of the pattern by the pattern shape measurement device 3 is performed for, for example, each layer on the wafer. Specifically, a film to be processed is formed on the wafer and a resist is applied onto the film to be processed. Then, a lithography process is performed for the wafer having the resist applied thereon. For example, an exposure process using a photo mask and a development process are performed for the resist on the wafer. For example, an imprint process using a template (imprint mask) may be used as the lithography process. In this way, a resist pattern is formed on the wafer.

Then, the pattern shape measurement device 3 measures the shape of the resist pattern. Then, the film to be processed is etched, using the resist pattern which has passed the measurement process as a mask. In this way, a wafer pattern corresponding to the resist pattern is formed on the wafer. When a semiconductor device is manufactured, for example, the process of forming the film to be processed, the lithography process, the pattern shape measurement process, and the etching process are repeatedly performed for each layer.

Figure 8:
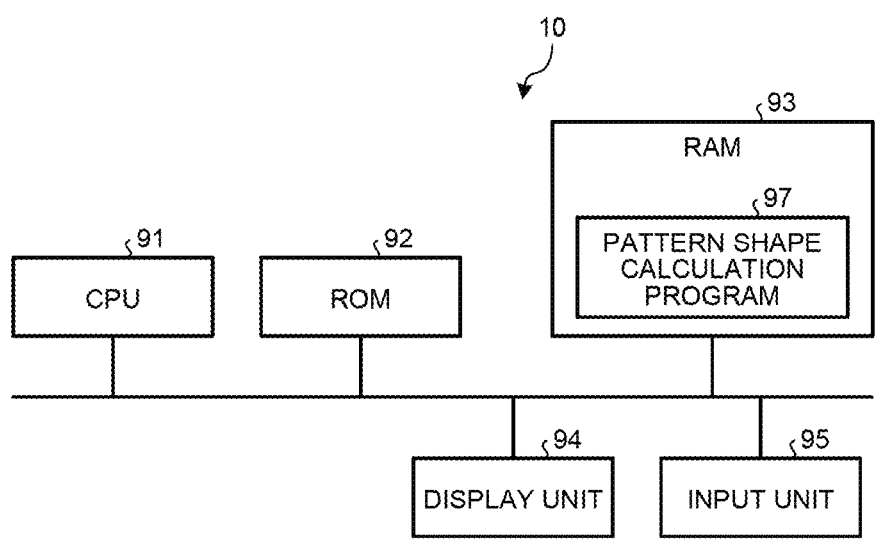
FIG. 8 is a diagram illustrating the hardware configuration of the pattern shape calculation device.

Next, the hardware configuration of the pattern shape calculation device 10 will be described. FIG. 8 is a diagram illustrating the hardware configuration of the pattern shape calculation device. The pattern shape calculation device 10 includes a central processing unit (CPU) 91, a read only memory (ROM) 92, a random access memory (RAM) 93, a display unit 94, and an input unit 95. In the pattern shape calculation device 10, the CPU 91, the ROM 92, the RAM 93, the display unit 94, and the input unit 95 are connected to each other through a bus line.

The CPU (processor) 91 determines a pattern using a pattern shape calculation program 97 which is a computer program. The pattern shape calculation program 97 is a computer program product having a (non-transitory computer readable recording medium) including a plurality of commands which can be executed by a computer and are used to calculate the shape of a pattern. In the pattern shape calculation program 97, the plurality of commands cause the computer to calculate the shape of a pattern.

The display unit 94 is a display device, such as a liquid crystal monitor, and displays, for example, the profile extraction conditions D1, the measured scattering profile extraction data D2, the virtual structure data D3, the shape parameter simulation setting D4, the virtual scattering profile data D5, the virtual scattering profile extraction data D6, the correspondence relationship information D7, and the calculated shape profile (measurement result) on the basis of instructions from the CPU 91. The input unit 95 includes a mouse or a keyboard and receives instruction information (for example, parameters required to calculate the shape of a pattern) which is input from the user. The instruction information input to the input unit 95 is transmitted to the CPU 91.

The pattern shape calculation program 97 is stored in the ROM 92 and is loaded to the RAM 93 through the bus line. FIG. 8 illustrates a state in which the pattern shape calculation program 97 is loaded to the RAM 93.

The CPU 91 executes the pattern shape calculation program 97 loaded to the RAM 93. Specifically, in the pattern shape calculation device 10, the CPU 91 reads the pattern shape calculation program 97 from the ROM 92, develops the pattern shape calculation program 97 in a program storage area of the RAM 93, and performs various processes, in response to an instruction which is input from the user through the input unit 95. The CPU 91 temporarily stores various kinds of data which are generated during various processes in a data storage area of the RAM 93.

The pattern shape calculation program 97 executed by the pattern shape calculation device 10 has a module configuration including the profile extraction unit 12, the simulation unit 13, and the fitting unit 14. These units are loaded to a main storage device and are generated in the main storage device.

In this embodiment, the periodic structure of a sample is a line pattern, but is not limited thereto. The periodic structure may be any pattern. For example, the periodic structure may be a two-dimensional pattern which is arranged in a two-dimensional direction or a hole pattern. The shape measurement method according to this embodiment may be applied to a periodic structure having any pattern cycle. In this embodiment, the electromagnetic waves used for substrate measurement are X-rays, but are not limited thereto. For example, electromagnetic waves having any wavelength may be used as long as they interfere with scattered light to generate a diffraction pattern.

As such, in the embodiment, the measured scattering profile extraction data D2 is extracted from the scattering profile of electromagnetic waves obtained when electromagnetic waves are incident on the periodic structure on the substrate, on the basis of the profile extraction conditions D1. In addition, the virtual scattering profile data D5 based on the virtual structure is generated using a simulation program. Then, the virtual scattering profile extraction data D6 is extracted from the virtual scattering profile data D5 on the basis of the profile extraction conditions D1. Then, the fitting between the measured scattering profile extraction data D2 and the virtual scattering profile extraction data D6 is performed. Then, the extraction of the measured scattering profile extraction data D2 and the fitting between the measured scattering profile extraction data D2 and the virtual scattering profile extraction data D6 are repeatedly performed while the shape parameter of the virtual structure is changed. Then, the shape of the periodic structure on the substrate is determined on the basis of the fitting result.

As such, after unnecessary shape parameters are excluded, fitting is performed. Therefore, it is possible to calculate desired shape parameters with high accuracy. As a result, it is possible to calculate the shape of a pattern with high accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-transitory computer readable medium that records a shape calculation program which causes a computer to calculate a shape of a periodic structure and to perform:
   extracting, from a first scattering profile of electromagnetic waves obtained when the electromagnetic waves are incident on a first periodic structure on a substrate, a second scattering profile, on the basis of a certain condition;
   extracting, from a third scattering profile calculated using a second periodic structure that is virtually set, a fourth scattering profile, on the basis of the certain condition;
   fitting the second scattering profile and the fourth scattering profile; and
   calculating a shape of the first periodic structure on the basis of the result of the fitting.

2. The non-transitory computer readable recording medium according to claim 1,
   wherein the shape calculation program causes the computer to further perform:
   repeating the extraction of the fourth scattering profile and the fitting while changing a shape parameter of the second periodic structure.

3. The non-transitory computer readable recording medium according to claim 1,
   wherein the shape calculation program causes the computer to further perform:
   performing a scattering intensity distribution simulation for the second periodic structure; and
   calculating the third scattering profile.

4. The non-transitory computer readable recording medium according to claim 1,
   wherein the certain condition is set on the basis of information about at least one of a scattering angle of the electromagnetic waves, an order of a scattering profile, and an inflection point of the first scattering profile.

5. The non-transitory computer readable recording medium according to claim 1,
   wherein the second and fourth scattering profiles are the coordinates of an inflection point.

6. The non-transitory computer readable recording medium according to claim 1,
   wherein, during the fitting, a difference between the second scattering profile and the fourth scattering profile is calculated,
   a shape parameter when the difference is the minimum is extracted, and
   the shape parameter is used as the shape of the first periodic structure.

7. The non-transitory computer readable recording medium according to claim 1,
   wherein the certain condition is a distance between a first maximum point of a waveform of the first scattering profile and a second maximum point that is adjacent to the first maximum point.

8. A shape calculation device that directs a processor to perform:
   a first extraction process that extracts, from a first scattering profile of electromagnetic waves obtained when the electromagnetic waves are incident on a first periodic structure on a substrate, a second scattering profile, on the basis of a certain condition;
   a second extraction process that extracts, from a third scattering profile calculated using a second periodic structure that is virtually set, a fourth scattering profile, on the basis of the certain condition;
   fitting the second scattering profile and the fourth scattering profile; and
   calculating a shape of the first periodic structure on the basis of the result of the fitting.

9. The shape calculation device according to claim 8,
   wherein the extraction of the fourth scattering profile and the fitting are repeatedly performed while a shape parameter of the second periodic structure is changed.

10. The shape calculation device according to claim 8,
    wherein the processor further performs a process of performing a scattering intensity distribution simulation for the second periodic structure and a process of calculating the third scattering profile.

11. The shape calculation device according to claim 8,
    wherein the certain condition is set on the basis of information about at least one of a scattering angle of the electromagnetic waves, an order of a scattering profile, and an inflection point of the first scattering profile.

12. The shape calculation device according to claim 8, wherein the second and fourth scattering profiles are the coordinates of an inflection point.

13. The shape calculation device according to claim 8, wherein the processor further performs:
during the fitting,
calculating a difference between the second scattering profile and the fourth scattering profile;
extracting a shape parameter when the difference is the minimum; and
using the shape parameter as the shape of the first periodic structure.

14. The shape calculation device according to claim 8, wherein the certain condition is a distance between a first maximum point of a waveform of the first scattering profile and a second maximum point that is adjacent to the first maximum point.

15. A shape measurement method comprising:
emitting electromagnetic waves so as to be incident on a first periodic structure on a substrate;
detecting the intensity of electromagnetic waves that are reflected from the first periodic structure and are scattered;
calculating a first scattering profile of the scattered electromagnetic waves on the basis of the intensity;
extracting a second scattering profile from the first scattering profile on the basis of a certain condition;
extracting, from a third scattering profile calculated using a second periodic structure that is virtually set, a fourth scattering profile, on the basis of the certain condition;
fitting the second scattering profile and the fourth scattering profile; and
calculating a shape of the first periodic structure on the basis of the result of the fitting.

16. The shape measurement method according to claim 15, further comprising:
repeating the extraction of the fourth scattering profile and the fitting while changing a shape parameter of the second periodic structure.

17. The shape measurement method according to claim 15, further comprising:
performing a scattering intensity distribution simulation for the second periodic structure; and
calculating the third scattering profile.

18. The shape measurement method according to claim 15,
wherein the certain condition is set on the basis of information about at least one of a scattering angle of the electromagnetic waves, an order of a scattering profile, and an inflection point of the first scattering profile.

19. The shape measurement method according to claim 15,
wherein the second and fourth scattering profiles are the coordinates of an inflection point.

20. The shape measurement method according to claim 15,
wherein, during the fitting, a difference between the second scattering profile and the fourth scattering profile is calculated,
a shape parameter when the difference is the minimum is extracted, and
the shape parameter is used as the shape of the first periodic structure.

* * * * *